United States Patent [19]
Lee

[11] 4,331,944
[45] May 25, 1982

[54] SWITCHED-CAPACITOR RESISTOR SIMULATION CIRCUITS

[75] Inventor: Man S. Lee, Belmont, Calif.

[73] Assignee: GTE Automatic Electric Laboratories, Inc., Northlake, Ill.

[21] Appl. No.: 171,523

[22] Filed: Jul. 23, 1980

[51] Int. Cl.³ ............................................. H03H 11/46
[52] U.S. Cl. .................................... 333/213; 330/107
[58] Field of Search ................. 333/173, 213; 330/107; 328/128; 307/594, 597, 603, 605

[56] References Cited
U.S. PATENT DOCUMENTS
4,179,665  12/1979  Gregorian ....................... 333/173 X

OTHER PUBLICATIONS
Lee et al., *Low-Sensitivity Switched-Capacitor Holder Filters*, IEEE Trans. on CS, Jun. 1980, pp. 475-480.
Inoue et al., *Switched-Capacitor Immittance Convertors Using a Single Operational Amplifier*, Electronics Letters, Sep. 25, 1980, pp. 770, 771.

*Primary Examiner*—Paul L. Gensler
*Attorney, Agent, or Firm*—Russell A. Cannon

[57] ABSTRACT

An integratable switched capacitor simulation circuit comprising an integrated capacitor C3 having bottom and top plates thereof electrically connected to first and second nodes, and a pair of integrated capacitors C1 and C2 having their top plates electrically connected together. The bottom plate of C2 is electrically connected to the output of a voltage follower that has its input terminal connected to the second node. A first switch means periodically connects the top plates of C1 and C2 to the first and second nodes at a prescribed rate. When the first node is connected to a voltage source and the bottom plate of C1 is connected to either ground or the first node, the circuit simulates a source resistor across the nodes. When the first node and bottom plate of C1 are connected to ground, the circuit simulates a grounded resistor. In alternate embodiments, the capacitances of C1 and/or C3 may be zero valued for presenting an open circuit across the terminals thereof. In yet another embodiment where C1 and C3 are zero valued and the first node is connected to ground, a second switch means essentially operating 180° out of phase with respect to the first switch means is located in the electrical connection of the bottom plate of C2 and the output terminal of the voltage follower for periodically connecting the bottom plate of C2 to the first node and the output of the voltage follower for causing the circuit to simulate a bilinear grounded resistor. In an alternate embodiment of this structure, the first node is connected to the output of a voltage source for simulating a bilinear source resistor.

23 Claims, 4 Drawing Figures

SWITCHED-CAPACITOR RESISTOR SIMULATION CIRCUITS

BACKGROUND OF INVENTION

This invention relates to switched capacitor circuits or networks and more particularly to switched capacitor circuit replacements of resistors.

Switched capacitor circuits for simulating resistors are described in the references "Sampled Analog Filtering Using Switched Capacitors as Resistor Equivalents" by J. T. Caves, et. al., IEEE Journal of Solid State Circuits, Vol. 12, No. 6, pages 592–599, December, 1977; "MOS Sampled Data Recursive Filters Using Switched Capacitor Integrators" by B. J. Hosticka, et. al., IEEE Journal of Solid State Circuits, Vol. 12, No. 6, pages 600–608, December, 1977; "Switched Capacitor Filter Design Using the Bilinear z-Transform" by G. C. Temes, et. al., IEEE Transactions on Circuits and Systems, Vol. 25, No. 12, pages 1039–1044, December, 1978; "Derivation of Switched Capacitor Filters From Active-RC Prototypes" by G. C. Temes, Electronics Letters, Vol. 14, No. 12, pages 361–362, June, 1978.

Techniques for reducing the effects of parasitic capacitances in switched capacitor circuits are also described in the article "Compensation for Parasitic Capacitances in Switched-Capacitor Filters" by G. C. Temes, et. al., Electronics Letters, Vol. 15, No. 13, pages 377–379, June, 1979. A number of the switched capacitor resistors disclosed in these references are susceptible to top and/or bottom plate parasitic capacitance effects. Also, a network using at least one of the simulated resistors disclosed in these references and LDI (lossless discrete integrator) inductors of the type disclosed in the article "Switched Capacitor Filters Using Floating-Inductance Simulation Circuit" by Man Shek Lee, Electronics Letters, Vol. 15, No. 20, pages 644–645, September, 1979, requires 4-phase, rather than 2-phase, timing control signals.

An object of this invention is the provision of novel switched capacitor structures for simulating resistors.

SUMMARY OF INVENTION

In accordance with this invention, an integratable switched capacitor circuit for simulating a resistor comprises: first and second nodes; voltage follower means having an input terminal electrically connected to said second node and having an output terminal; first capacitor means having first and second terminals; first means electrically connecting the first terminal of said first capacitor means to the output terminal of said voltage follower means; second means electrically connecting said first node to one of a ground reference potential and the output terminal of a voltage source that is associated with a ground reference potential; and first switch means for periodically connecting the second terminal of said first capacitor means to said first and second nodes at a prescribed switching frequency so as to simulate a resistor across the nodes. In alternate embodiments, a second capacitor means is electrically connected across the nodes and/or a third capacitor means is connected between the switched terminal of the first capacitor means and either ground or the first node. The capacitances presented by the capacitor means are selected for causing the circuit to approximate LDI resistors and bilinear resistors. In other embodiments, the capacitor means are integrated capacitors having bottom plates connected to the output of a voltage source or a ground reference potential for rendering the circuit relatively insensitive to bottom plate parasitic capacitance effects of the integrated capacitors thereof. In a further embodiment which does not include the second and third capacitor means and in which the second means electrically connects the first node to either a voltage source or ground, the first means comprises a second switching means for periodically connecting the bottom plate of an integrated capacitor type of first capacitor means to the output terminal of the voltage follower means and to the first node for simulating a bilinear source or grounded resistor that is relatively insensitive to bottom plate parasitic capacitance effects associated with the integrated capacitor.

DESCRIPTION OF DRAWING

This invention will be more fully understood from the following detailed description of preferred embodiments thereof, together with the drawing in which.

DESCRIPTION OF PREFERRED EMBODIMENTS

Some embodiments of this invention are described in the articles, "Switched Capacitor Filters Using Floating-Inductance Simulation Circuits" by Man Shek Lee, Electronics Letters, September 1979, Vol. 15, No. 20, pages 644–645, and "Low-Sensitivity Switched-Capacitor Ladder Filters" by Man Shek Lee and C. Chang, IEEE Transactions on Circuits and Systems, Vol. 27, No. 6, June, 1980, pages 475–480, which are incorporated herein by reference.

Figure 1:
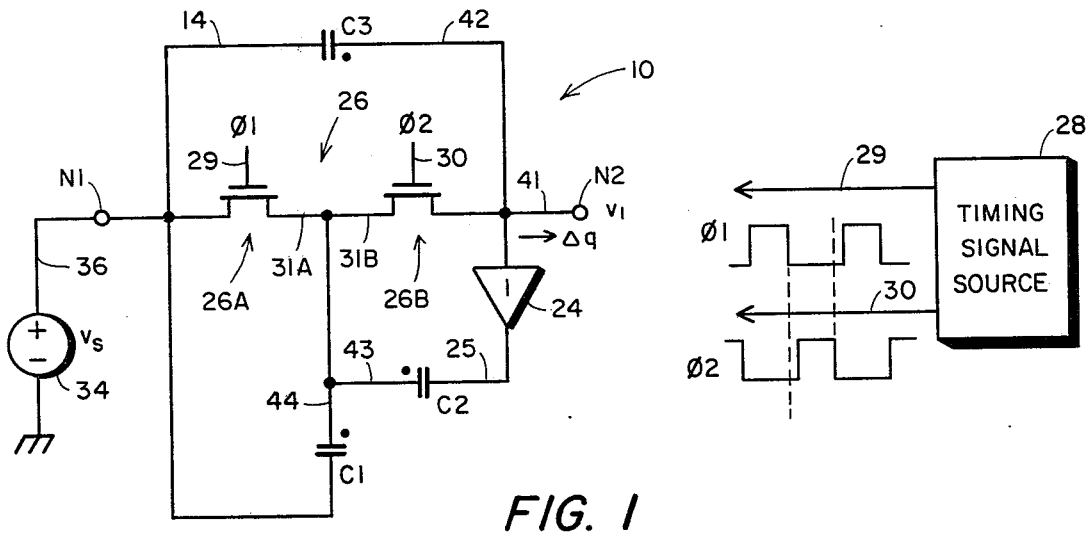
FIG. 1 is a schematic circuit diagram of a voltage source 34 driving a switched capacitor simulation circuit 10 embodying this invention so as to cause the circuit 10 to simulate a source resistor.

In a preferred embodiment of this invention in FIG. 1 that is implemented in fully integrated circuit form, a switched capacitor circuit or network 10 for simulating a source resistor across a pair of nodes N1 and N2 thereof comprises: integrated capacitors C1, C2 and C3; a voltage follower 24; switch means 26; and a source 28 of timing control signals. The node N1 is connected to the output terminal of a voltage source 34 which may be the output of an integrated operational amplifier. The node N2 is connected to the input of the voltage follower 24 which is essentially a voltage controlled voltage source having unity gain. The output of the voltage follower is a very low impedance so that it is essentially insensitive to impedance loading effects on the output terminal thereof. The input impedance of the voltage follower, however, is very high. The voltage source 34 normally delivers whatever output current is demanded by external circuitry such as the circuit 10.

The dots adjacent the one sides of the integrated capacitors indicate the locations of the top plates thereof. The integrated capacitor C3 is connected across the nodes, with its bottom plate terminal 14 directly electrically connected to N1 and the output terminal 36 of the voltage source. Since the output impedance of this voltage source is already substantially zero ohms, the bottom plate parasitic capacitance effects associated with the integrated capacitor C3 do not effect the operation of the voltage source 34 or the circuit 10. The bottom plates of integrated capacitors C1 and C2 are also connected to the output terminals of associated voltage sources to obviate the effects of the bottom plate parasitic capacitances thereof.

The switch means 26 comprises a pair of integrated MOS FET transistors that are connected in series between N1 and N2. The common terminals 31 of the transistors are connected to the top plates of C1 and C2. The gate electrodes of the transistors are driven by different ones of the two-phase non-overlapping timing control signals $\phi 1$ and $\phi 2$ that are produced by the source 28. These timing signals are 180° out of phase with respect to each other as is indicated in FIG. 1. The duty cycles of these signals may be much less than 50%, although they are preferably approximately 50% to provide maximum settling time for these pulse signals. The switching frequency of the control signals is $f = 1/T$, where T is the period of a switching cycle. The switching means completes a cycle of operation every T seconds. The switching frequency is normally greater than the Nyquist rate.

In operation, C3 is continuously charged to the difference voltage across N1 and N2 since it is directly electrically connected between these nodes. When the control signal $\phi 1$ is positive, only the switching transistor 26A conducts to connect the top plates of C1 and C2 to node N1 for discharging C1 and charging C2 to the difference voltage across the nodes. Conversely, when $\phi 2$ is positive, only the switching transistor 26B conducts to connect the top plates of C1 and C2 to the other node N2 for discharging C2 and charging C1 to the difference voltage across the nodes. This operation of the switch means 26 causes circuit 10 to simulate a source resistor across the nodes. It can be shown that by proper selection of the capacitances of the three integrated capacitors that the resistor simulated by the circuit 10 approximates an LDI resistor, approximates, a bilinear resistor, or is a truly bilinear resistor. Consideration of the operation of the simulation circuit 10 in FIG. 1 reveals that the top plates of the three integrated capacitors are either directly connected to or periodically connected to a floating node N2 such that the circuit 10 is susceptible to top plate parasitic capacitance effects of these capacitors. Since the top plate parasitic capacitances of integrated capacitors are very small, however, their effects can be neglected.

The LDI (lossless discrete integrator) analog to digital transformation $$S = \frac{1}{T}(z^{\frac{1}{2}} - z^{\frac{1}{2}}) \tag{1}$$

and the bilinear transformation $$S = \frac{2}{T} \frac{z-1}{z+1} \tag{2}$$

where s is the Laplace operator in the s-domain, z is the operator in the discrete time or z-domain, and T is the reciprocal of the sampling rate, are used to transform continuous time analog definitions of electrical networks in the s-domain into corresponding discrete time definitions of corresponding switched capacitor sampled networks in the z-domain. The general representation of the differential charge-voltage relationship for an LDI and a bilinear resistor are determined to be $$\Delta Q(z) = \frac{T}{R} z^{-\frac{1}{2}} V(z) \tag{3}$$

and $$\Delta Q(z) = \frac{T}{R}(1 + z^{-1})V(z) \tag{4}$$

where Q(z) is the charge in the discrete time domain, T is the sampling period, R is resistance, and V(z) is the voltage across the nodes N1 and N2.

It is known that the voltages and currents in LDI reactive elements are sampled at times that are T/2 seconds apart. The voltage and current in an LDI resistor, however, are sampled at the same time. This means that Kirchhoff's voltage and current laws cannot be satisfied simultaneously for LDI resistive elements defined by equation (3) and LDI reactive elements. It is therefore necessary to develop expressions such as $$i_R(nT) = i_R(nT + T/2) \tag{5}$$

$$i_R(nT) = i_R(nT - T/2) \tag{6}$$

$$i_R(nT) = \tfrac{1}{2}\{i_R(nT - T/2) + i_R(nT + T/2)\} \tag{7}$$

that approximate the current in an LDI resistor. Consideration of these equations (5), (6) and (7) in the z domain and associated relationships for voltage and current in a resistor reveals that the resistances associated with these currents are $Rz^{\frac{1}{2}}$, $Rz^{-\frac{1}{2}}$, and $2R(z^{\frac{1}{2}} + z^{-\frac{1}{2}})^{-1}$, respectively.

The currents defined by equations (5) and (6) are those existing a half-period before and after the time nT, and that defined by equation (7) is the average value of the currents in equations (5) and (6). These currents are expressed in terms of the differential charge and voltage as $$\Delta Q(z) = \frac{T}{R} z^{-1} V(z) \tag{8}$$

$$\Delta Q(z) = \frac{T}{R} V(z) \tag{9}$$

$$\Delta Q(z) = \frac{T}{2R}(1 + z^{-1}) V(z) \tag{10}$$

It will be noted that equation (10) corresponds to that of a bilinear resistor, see equation (4), which approximates an LDI resistor if the switching frequency 1/T is high enough. It is desirable that the differential charge-voltage transfer function for the circuit 10 satisfy one of the equations (8)–(10) if it is to simulate a resistor that approximates an LDI resistor. Similarly, it is desirable that such a differential charge-voltage transfer function for circuit 10 satisfy equation (4) if it is to simulate a bilinear resistor.

It has been found convenient to define the capacitances of the integrated capacitors as $$C1 = (1-g)C \qquad (11)$$

$$C2 = gC \qquad (12)$$

$$C3 = (g-h)C \qquad (13)$$

where "g" and "h" are constants and C is capacitance. The continuous time representation of differential charge in line 41 is representable as $$\Delta q(nT) = (g - h) C \{(v_1(nT) - v_s(nT) + \qquad (14)$$
$$v_s(nT - T) - v_1(nT - T)\} + gC\{(v_1(nT - T) - v_s(nT - T)\} + $$
$$(1 - g)C\{v_1(nT) - v_s(nT)\}$$

$$= (1 - h)C\{v_1(nT) - v_s(nT)\} + \qquad (15)$$
$$hC\{v_1(nT - T) - v_s(nT - T)\}$$

where the first term is equation (14) is the charge in line 42 and C3, the second term in equation (14) is the charge flow in line 43 and C2, the third term in equation (14) is the charge flow in line 44 and C1, $v_s$ is the source voltage on node N1, $v_l$ is the voltage between node N2 and ground, $v_s(nT)$ is the voltage on node N1 at time nT, $v_s(nT-T)$ is the voltage on node N1 at time nT−T, and q(nT) is the net charge in line 41 from time $-\infty$ to time nT. Assuming that the voltage v(nT) is substantially equal to the voltage v(nT−T), then the average current in line 41 is $$i(nT) = \frac{\Delta q(nT)}{T} = \frac{C(v_1(nT) - v_s(nT))}{T} \qquad (16)$$

Considering the relationship for current and voltage in a resistor, it is seen that the circuit 10 in FIG. 1 simulates a resistor having a resistance $$R = T/C \qquad (17)$$

across the nodes thereof.

Consideration of the equations (14) and (15) reveals that the multiplier constants there must satisfy the relationships $$0 < g < 1 \qquad (18)$$

$$h < g \qquad (19)$$

for the capacitances of C1, C2 and C3 to all be positive. Taking the z transform of the differential charge-voltage relationship in equation (15) gives the expression $$\Delta Q(z) = C(1-h+hz^{-1})(V_1(z)-V_s(z)) \qquad (20)$$

Figure 2:
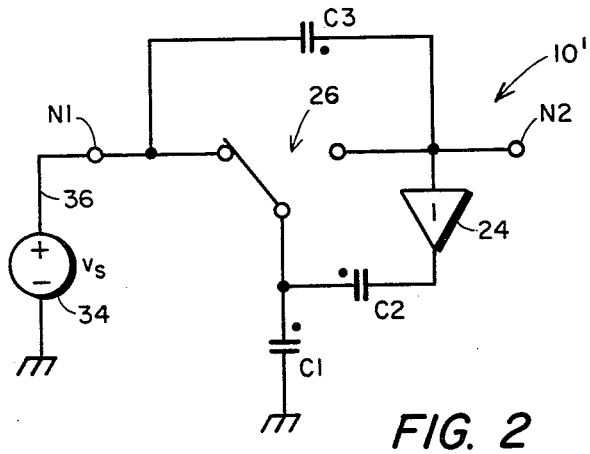
FIG. 2 is a schematic circuit diagram of an alternate embodiment of this invention for simulating a source resistor, the switch means 26 being shown in schematic form.

The network 10 has a similar differential charge-voltage relationship and also operates to simulate a source resistor when the bottom plate of C1 is connected to ground instead of the node N1, as is illustrated in FIG. 2. Comparison of equation (20) with the expressions in equations (4) and (8)-(10) reveals that the circuit 10 does either simulate or approximate a resistor across the nodes N1 and N2 thereof. The magnitude of the simulated source resistance is changed by varying T and/or the constants g and h and the capacitance C which control the capacitances of C1, C2 and C3. The circuit 10 in FIG. 1 also simulates a source resistor when the circuit comprises either C1 and/or C2, or C3 together with C1 and/or C2, as is described more fully hereinafter.

More specifically, when h=0 and 0<g<1, the equation (20) reduces to $$\Delta Q(z) = CV(z) \qquad (21)$$

where the capacitances of C1, C2 and C3 are all positive and greater than 0. Comparison of equations (21) and (9) reveals that the circuit 10 now simulates a resistor which approximates an LDI resistor having a resistance R=T/C. If the constant g=0 when h=0, then the capacitances of C2 and C3 are both 0 and the circuit 10 reduces to that disclosed in the aforementioned Temes-IEEE Circuits & Systems article. Also, where the node N2 is connected to a virtual ground point such as the inverting input to a differential input operational amplifier (not shown), then the voltage v1=0 and the voltage follower 24 can be eliminated, since both the input and output terminals thereof are then at ground potential. In this instance, the term V1(z) in equation (20) vanishes and the minus sign there means that current is flowing in a direction opposite to that previously indicated.

In an alternate embodiment where g=h=1, then the capacitances of C1 and C3 are zero such that these elements are replaced by open circuits. The differential charge-voltage relationship for this circuit then reduces to $$\Delta Q(z) = Cz^{-1}V(z) \qquad (22)$$

A comparison of equations (22) and (8) reveals that this modified form of circuit 10 also simulates a resistor that approximates an LDI resistor.

In another modified form of this invention in which h=½ and ½<g<1, the circuit 10 includes all three of the capacitors C1, C2 and C3. The differential charge-voltage relationship for this simulation circuit is $$\Delta Q(z) = \frac{C}{2}(1 + z^{-1})V(z) \qquad (23)$$

Comparison of equations (23), (10) and (4) reveals that the modified circuit 10 now simulates a source resistor across the nodes N1 and N2 which approximates an LDI resistor and which is a bilinear resistor. In the special case where g=h=½, the capacitance of C3 is reduced to zero and C1=C2. The modified circuit 10 now only requires two equal-valued capacitors C1 and C2 having capacitances C/2 for simulating a bilinear source resistor having a resistance R=T/C. In the special case where g=1, then the capacitance of C1 is reduced to 0 and the element C1 is replaced with an open circuit. In this instance, the modified network requires only two capacitors C2 and C3 having capacitances 2C and C, respectively, and simulating a bilinear source resistor.

In yet another embodiment of this invention, the capacitor C3 may be replaced by an open circuit. The differential charge-voltage relationship for this modified network is also defined by equation (20), where the constant g is substituted for the constant h. This modified network 10 simulates a bilinear source resistor only when $g=\frac{1}{2}$. Although the modified network simulates a resistor for other values of g between 0 and 1, the simulated resistor is no longer a bilinear resistor.

Figure 3:
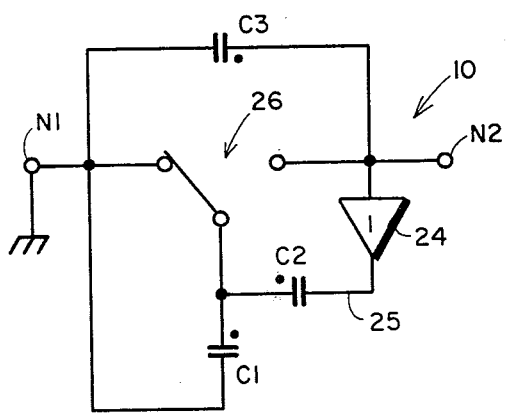
FIG. 3 is a schematic circuit diagram of another embodiment of this invention in which node N1 is connected to ground for causing the circuit 10 to simulate a grounded resistor.

It is also possible to connect node N1 to a ground reference potential so that the voltage $v_s = 0$ volts, as is illustrated in FIG. 3. This connection causes the network 10 there to simulate a grounded bilinear resistor across the nodes N1 and N2. The differential charge-voltage relationship in the z domain for the circuit in FIG. 3 is also defined by equation (20), with $V_s(z) = 0$ volts. The circuit in FIG. 3 may be modified in the manner described above for the network 10 in FIG. 1 to produce alternate embodiments of this invention that simulate a grounded resistor.

Figure 4:
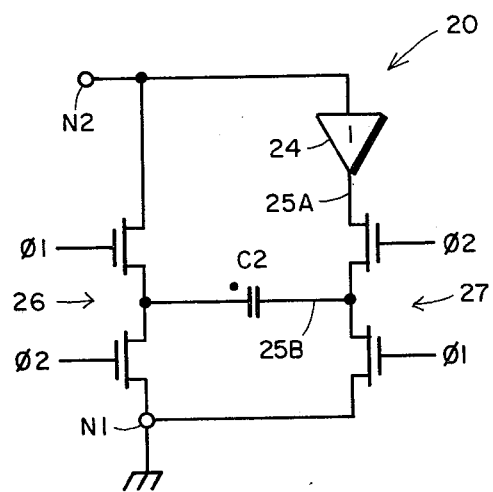
FIG. 4 is a schematic circuit diagram of an alternate embodiment of this invention in which node N1 is connected to ground and a second switch means 27 is inserted in line 25, the switch means 27 being operative for causing the circuit 20 to simulate a grounded bilinear resistor.

In yet another embodiment of this invention in FIG. 4, a circuit 20 for simulating a grounded bilinear resistor comprises a single capacitor C2, a voltage follower 24, and a pair of switch means 26 and 27. The circuit 20 is the same as the circuit 10 in FIG. 3, with C1=C2=0 and a second switch means 27 inserted in line 25. The second switch means periodically connects the bottom plate of C2 to the output terminal of the voltage follower and to node N1. The switch means 26 and 27 operate as is shown in FIG. 4, for alternately connecting the top plate of C2 between nodes N2 and N1, and connecting the bottom plate of C2 between the output of the voltage follower and N1, respectively. Alternatively, the circuit 20 simulates a bilinear source resistor across the nodes when N1 is connected to the output terminal of a voltage source.

Although this invention is described in relation to preferred embodiments thereof, variations and modifications will occur to those skilled in the art. By way of example, the simulation circuits may be realized with integrated circuit technologies other than MOS and in other than fully integrated circuit form. The simulation circuits may also be fully implemented with discrete components and with only a portion thereof in integrated circuit form. Further, the switch means may comprise other types of switching elements such as discrete transistors, mechanical switches, relays, and other types of integrated switches. Additionally, g and/or h may be negative, although this may require one or more of the capacitors to have a negative capacitance. And when both C1 and C3 are present, C2 is preferably not equal to zero since C3 may then be negative. The scope of this invention is therefore defined by the appended claims rather than the aforementioned detailed descriptions of preferred embodiments thereof.

What is claimed is:

1. An integratable switched capacitor circuit for simulating a resistor comprising:
   first and second nodes;
   voltage follower means having an input terminal electrically connected to said second node and having an output terminal;
   first capacitor means having first and second terminals;
   first means electrically connecting the first terminal of said first capacitor means to the output terminal of said voltage follower means;
   second means electrically connecting said first node to one of a ground reference potential and the output terminal of a voltage source that is associated with a ground reference potential; and
   first switch means for periodically electrically connecting the second terminal of said first capacitor means to said first and second nodes at a prescribed switching frequency so as to simulate a resistor across said nodes.

2. The circuit according to claim 1 wherein said second means electrically connects said first node to the output terminal of a voltage source that is associated with a ground reference potential for causing the circuit to simulate a source resistor across said nodes.

3. The circuit according to claim 1 wherein said second means electrically connects said first node to a ground reference potential for causing the circuit to simulate a grounded resistor across said nodes.

4. The circuit according to claim 2 or 3 comprising second capacitor means having first and second terminals electrically connected to ground and the second terminal of said first capacitor means, respectively.

5. The circuit according to claim 4 wherein said first and second capacitor means each provide a positive capacitance C/2 between the terminals thereof for causing the circuit to simulate a bilinear resistor having a resistance R=T/C across said nodes, where T is the reciprocal of the switching frequency, said switch means completes a full cycle of operation every T seconds, and the circuit is characterized by the bilinear transformation $$\frac{2}{T} \cdot \frac{z-1}{z+1} = s.$$

6. The circuit according to claim 4 wherein the capacitances of said first and second capacitor means are gC and (1−g)C, respectively, and 0<g<1.

7. The circuit according to claim 4 wherein said first and second capacitor means are integrated capacitors having bottom plate terminals electrically connected to the output terminal of said voltage follower means and ground, respectively, for rendering the circuit relatively insensitive to bottom plate parasitic capacitance effects associated with said integrated capacitors.

8. The circuit according to claim 2 comprising second capacitor means having first and second terminals electrically connected to said first node and the second terminal of said first capacitor means, respectively.

9. The circuit according to claim 8 wherein said first and second capacitor means each provide a positive capacitance C/2 between the terminals thereof for causing the circuit to simulate a bilinear source resistor having a resistance R=T/C between said nodes, where T is the reciprocal of the switching frequency, said switch means completes a full cycle of operation every T seconds, and the circuit is characterized by the bilinear transformation.

10. The circuit according to claim 8 wherein the capacitances of said first and second capacitor means are gC and (1−g)C, respectively and 0<g<1.

11. The circuit according to claim 8 wherein said first and second capacitor means are integrated capacitors having bottom plate terminals electrically connected to the output terminal of said voltage follower means and said first node, respectively, for causing the circuit to simulate a source resistor that is relatively insensitive to bottom plate parasitic capacitance effects associated with said integrated capacitors.

12. The circuit according to claim 2 or 3 comprising second capacitor means having first and second terminals electrically connected to said first and second nodes, respectively.

13. The circuit according to claim 12 wherein said second and first capacitor means provide capacitances of C and 2C across the terminals thereof for simulating a bilinear resistor having a resistance $R=T/C$ between said nodes, where T is the reciprocal of the switching frequency, said switch means completes a full cycle of operation every T seconds, and the circuit is characterized by the bilinear transformation.

14. The circuit according to claim 12 wherein said first and second capacitor means are integrated capacitors having bottom plate terminals electrically connected to the output terminal of said voltage follower means and said first node, respectively, for rendering the circuit relatively insensitive to bottom plate parasitic capacitance effects associated with said integrated capacitors.

15. The circuit according to claim 2 or 3 further comprising second capacitor means having a first terminal electrically connected to one of the first node and ground reference potential, and having a second terminal electrically connected to the second terminal of said first capacitor means.

16. The circuit according to claim 15 further comprising a third capacitor means having first and second terminals electrically connected to said first and second nodes, respectively.

17. The circuit according to claim 16 wherein said first, second and third capacitor means provide capacitances gC, (1−g)C, and (g−H)C, respectively, across the terminals thereof for causing the circuit to simulate a resistor having a resistance $R=T/C$ across said nodes, where T is the reciprocal of the switching frequency and said switching means completes a full cycle of operation every T seconds.

18. The circuit according to claim 17 wherein g and h are constants having positive values and satisfy the conditions $0<g<1$ for causing the capacitances presented by said capacitor means to be positive.

19. The circuit according to claim 18 wherein g and h satisfy the requirements that $h=\frac{1}{2}$ and $\frac{1}{2}<g<1$ for causing the circuit to simulate a bilinear resistor having a resistance $R=T/C$ between said nodes, and the circuit is characterized by the bilinear transformation.

20. The circuit according to claim 18 wherein said first and second capacitor means are integrated capacitors having top plate terminals thereof electrically connected together for alternate connection to said first and second nodes by said switch means and said third capacitor means is an integrated capacitor having its bottom plate terminal electrically connected to said first node for rendering the circuit relatively insensitive to bottom plate parasitic capacitance effects associated with said integrated capacitors.

21. The circuit according to claim 17 wherein $g=h$ and $0<g<1$ for causing said third capacitor means to provide zero capacitance, which is essentially an open circuit, across the terminals thereof.

22. The circuit according to claim 1 wherein said second means electrically connects said first node to one of a ground reference potential and the output terminal of a voltage source and wherein said first means comprises second switching means operating at the prescribed switching frequency and a phasing with respect to said first switching means for periodically electrically connecting the first terminal of said first capacitor means to the output terminal of said voltage follower means and to said first node as said first switch means connects said second terminal of said first capacitor means to said first and second nodes, respectively, for simulating one of a grounded bilinear resistor and a bilinear source resistor between said nodes when the circuit is characterized by the bilinear transformation.

23. The circuit according to claim 22 wherein said first capacitor means is an integrated capacitor in which the bottom plate terminal thereof is said first terminal so as to render the simulated resistor relatively insensitive to bottom plate parasitic capacitance effects associated with the integrated capacitor.

* * * * *